United States Patent [19]

Tanizawa

[11] Patent Number: 4,928,164

[45] Date of Patent: May 22, 1990

[54] INTEGRATED CIRCUIT DEVICE HAVING A CHIP

[75] Inventor: Tetsu Tanizawa, Kawasaki, Japan

[73] Assignee: Fujitsu Limited, Kawasaki, Japan

[21] Appl. No.: 393,037

[22] Filed: Aug. 10, 1989

Related U.S. Application Data

[63] Continuation of Ser. No. 310,024, Feb. 10, 1989, abandoned, which is a continuation of Ser. No. 932,288, Nov. 19, 1986, abandoned.

[30] Foreign Application Priority Data

Nov. 19, 1985 [JP] Japan .................. 60-259396

[51] Int. Cl.$^5$ .............. H01L 27/10; H01L 27/02; H01L 29/04
[52] U.S. Cl. .................. 357/45; 357/23.11; 357/35; 357/41; 357/42; 357/43; 357/44; 357/49; 357/55; 357/59
[58] Field of Search .............. 357/45, 45 M, 41, 42, 357/43, 44, 23.1, 34, 35, 23.11, 49, 55, 59 E, 59 G, 59 K

[56] References Cited

U.S. PATENT DOCUMENTS

| | | | |
|---|---|---|---|
| 4,246,592 | 1/1981 | Bartlett | 357/45 |
| 4,353,085 | 10/1982 | Sakurai | 357/42 |
| 4,471,368 | 9/1984 | Mohsen | 357/45 |
| 4,649,413 | 3/1987 | Kelly | 357/45 |
| 4,661,815 | 4/1987 | Takayama et al. | 357/45 |
| 4,668,972 | 5/1987 | Sato et al. | 357/45 |
| 4,672,416 | 6/1987 | Nakazato et al. | 357/45 |
| 4,682,202 | 7/1987 | Tanizawa et al. | 357/45 |
| 4,701,777 | 10/1987 | Takayama et al. | 357/45 |

FOREIGN PATENT DOCUMENTS

| | | |
|---|---|---|
| 0119059 | 9/1984 | European Pat. Off. ......... 357/45 M |
| 59-163837 | 9/1984 | Japan . |
| 60-233838 | 11/1985 | Japan . |

*Primary Examiner*—Andrew J. James
*Assistant Examiner*—Ngan Van Ngo
*Attorney, Agent, or Firm*—Staas & Halsey

[57] ABSTRACT

A semiconductor chip circuit device includes cell arrays having pairs of an n-channel device formation region and a p-channel device formation region. Conductive power source lines are selectively formed between the pairs and are situated in grooves in the substrate. The conductive lines are selectively connected to impurity introduction regions in each formation region of each pair. An insulating layer is formed in the grooves over the conductive lines, and wirings selectively connect a plurality of pairs formed on the insulating layer.

11 Claims, 7 Drawing Sheets

INTEGRATED CIRCUIT DEVICE HAVING A CHIP

This is a continuation of co-pending application Ser. No. 07/310,024 filed on Feb. 10, 1989, now abandoned, which is a continuation of co-pending application Ser. No. 932,288 filed on 11/19/86, now abandoned.

BACKGROUND OF THE INVENTION

1. Field of the Invention

The present invention relates to an integrated circuit device having a chip, and more particularly to a gate array, in which a plurality of cell arrays having a plurality of cells formed in an array therein are arranged.

2. Description of the Related Art

In a conventional LSI chip such as a gate array, etc., for example, in the case of a complementary LSI such as a complementary MOS (CMOS), etc., pairs of a p-channel device formation region and an n-channel device formation region are repeatedly formed on the same chip, and a wiring region (WR) is provided between the pairs of regions. In the p-channel device formation region, for example, a p-channel MOS transistor is formed, and in the n-channel device formation region, an n-channel MOS transistor is formed. An active layer, etc., is not formed on the semiconductor substrate at the wiring region but the wiring is covered by an insulating layer. Further, the power source lines of the chips are usually provided in an upper wiring layer.

In the prior art, however, a power source line is provided in such a manner that it spans a device formation region and a wiring region, and thus the wiring efficiency is lowered and an improvement of the miniaturization of device can not be realized.

SUMMARY OF THE INVENTION

An object of the present invention is to provide an integrated circuit device having a chip wherein the layout efficiency on a semiconductor substrate can be improved.

Another object of the present invention is to provide an integrated circuit device having a chip wherein the electromigration effect of a power source line can be suppressed, resulting in an improvement of the responsitivity of a gate array.

According to the present invention there is provided an integrated circuit device having a chip comprising: cell arrays consisting of a plurality of cells, the cells comprising impurity induction regions respectively; and conductive lines selectively formed between the cell arrays and embedded in the substrate together with the cell array, the embedded conductive lines being selectively connected to the impurity induction regions; an insulating layer being formed on the embedded conductive lines and on wiring embedded in the substrate and selectively connecting the plurality of cells.

BRIEF DESCRIPTION OF THE DRAWINGS

Further advantages and details of the present invention will be explained with reference to the accompanying drawings in which.

DESCRIPTION OF THE PREFERRED EMBODIMENTS

To enable a better understanding of the present invention, a description of the prior art will be first given.

Figure 1:
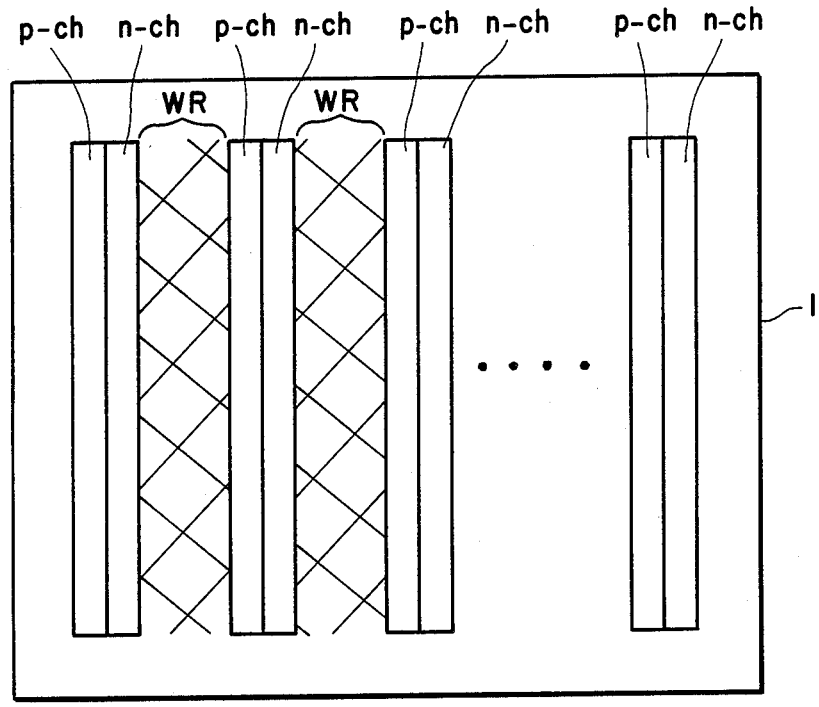
FIG. 1 is a schematic view of a conventional complementary LSI cell.

FIG. 1 is a schematic view of a conventional complementary LSI cell. In FIG. 1, pairs of a p-channel (p-ch) device formation region and an n-channel (n-ch) device formation region are repeatedly formed on a chip 1. A wiring region (WR) in which a gate-forming wiring is formed is provided between the p-ch device formation regions and the n-ch device formation regions of adjacent pairs. Further, a wiring layer connecting gates is formed in the WR. Although not shown in the figure, an active layer is not formed on the semiconductor substrate of the chip 1, and only an insulating layer is formed on the WR. Further, a power source line for the chip 1 is usually provided on the upper portion of the WR. This power source line is connected to the lower portion of the WR, through a through hole, or to devices.

Since, as described above, the power source line spans the device formation region and the WR, the wiring efficiency and the degree the integration of the LSI chip are lowered.

Japanese Unexamined Patent Publication (Kokai) No. 59-163837 discloses a semiconductor integrated circuit comprising a plurality of cell arrays with electric elements and power source lines positioned between the cell arrays but not embedded in a chip.

Figure 2:
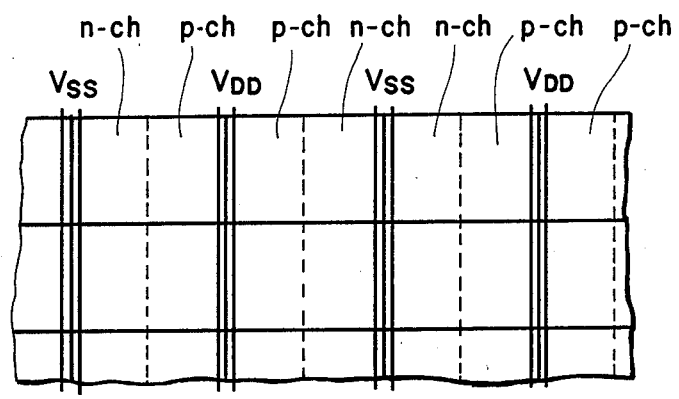
FIG. 2 is a schematic view of another example of a conventional cell array.

FIG. 2 is a schematic view of the cell arrays and the pattern of the power source lines disclosed in Japanese Unexamined Patent Publication No. 59-163837.

In FIG. 2, n-ch denotes an element region including a plurality of n-channel MOS, and p-ch denotes an element region including a plurality of p-channel MOS; $V_{SS}$ and $V_{DD}$ are power source lines. Pairs of n-ch and p-ch are formed on each side of the $V_{SS}$ or $V_{DD}$ respectively, but the power source line is not used as a connecting layer which connects the same type of channels to each other.

Figure 3:
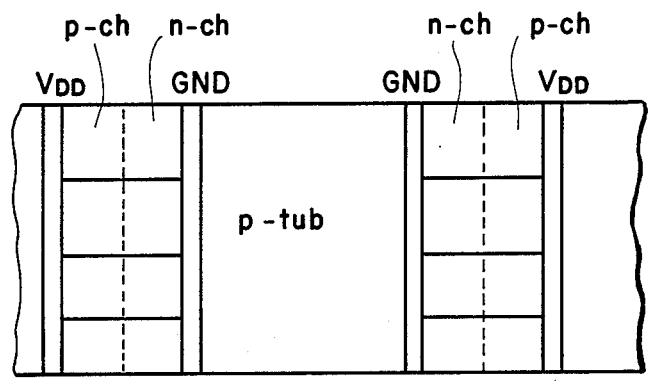
FIG. 3 is a schematic view of still another example of a conventional cell.

Japanese Unexamined Patent Publication (Kokai) No. 60-233838 discloses a semiconductor integrated circuit device comprising a plurality of cell arrays and a power source line and wiring region positioned between the cell arrays, as shown in FIG. 3, but the power source lines ($V_{DD}$, GND) are not embedded in a substrate and do not create a contact between the cells (p-ch, n-ch).

Figure 4:
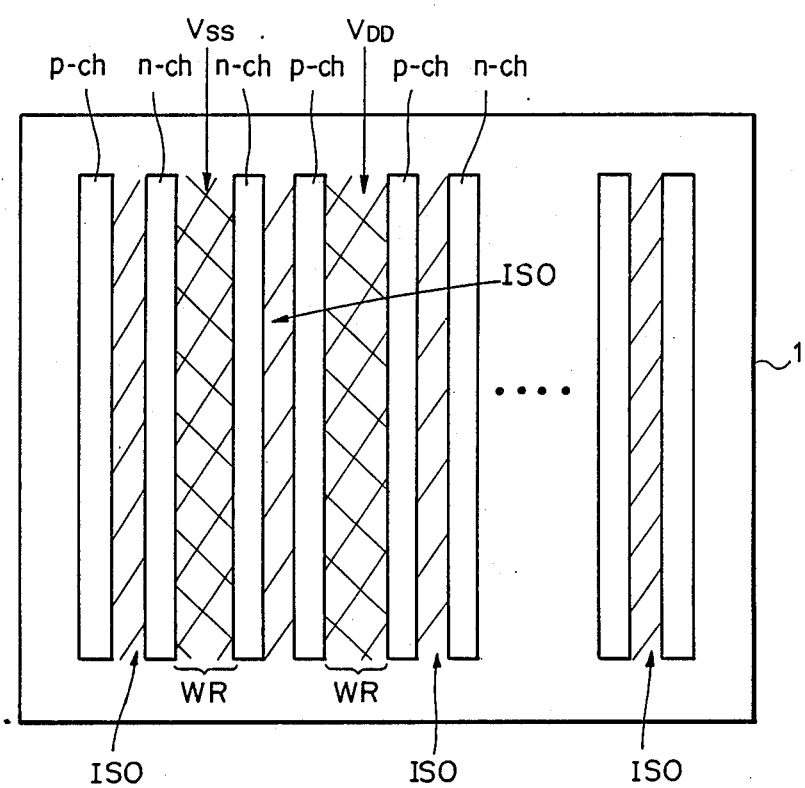
FIG. 4 is a schematic view of a complementary LSI cell array and wiring region (WR) pattern according to the present invention.

FIG. 4 is a schematic view of complementary cell arrays and wiring channel region (WR) patterns according to the present invention.

In FIG. 4, on a chip 1 of a semiconductor substrate, pairs of a p-channel (p-ch) device formation region and an n-channel (n-ch) device formation region are formed each side of the wiring channel region (WR). An isolation region (ISO) is formed between the n-channel and p-channel device formation region of each pair. Power source lines $V_{SS}$ and $V_{DD}$ (not shown) are embedded in the WR in the chip 1, and at the same time, are connected to the n-channel and p-channel device formation regions.

Figure 5A:
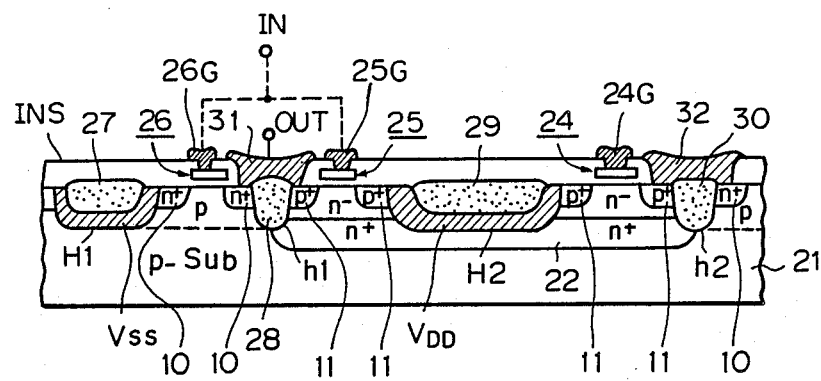
FIG. 5A is a cross-sectional view of a main portion of an LSI chip according to the present invention.
Figure 5B:
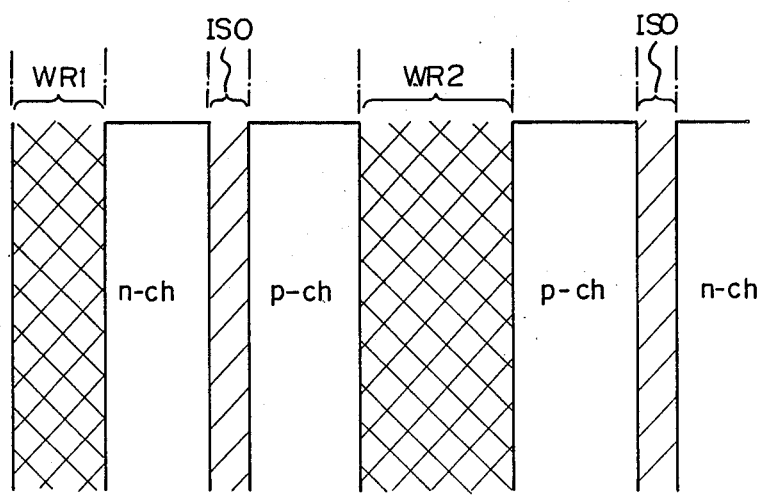
FIG. 5B is a top plan view of FIG. 5A.

FIG. 5A is a cross-sectional view of a main portion of an LSI chip and FIG. 5B is an upper plan view thereof.

In FIG. 5A, an n-ch MOS transistor 26 is formed on an n-ch device region in a p type semiconductor substrate 21, and p-ch MOS transistors 24 and 25 are formed on a p-ch device region. Further, a groove H1 is formed between the n-ch MOS transistor 26 and another n-ch MOS transistor (not shown) adjacent thereto. In the groove H1, a power source line $V_{SS}$ is formed, which is embedded in an insulating layer 27. Further, on the insulating layer 27, an insulating film INS is formed so that a wiring channel region WR1 (FIG. 5B) is constituted. A groove H2 is formed between the p-ch MOS transistors 24 and 25. In the groove H2, a power source line $V_{DD}$ is formed, which is embedded in an insulating layer 29. Further, on the insulating layer 29, an insulating film INS is also formed so that a wiring channel region WR2 is constituted. These power source lines $V_{DD}$ and $V_{SS}$ can be made of A1, conductive polycrystalline Si, etc. When the power source lines are made of the conductive polycrystalline Si, the conductive type thereof is an same as that of the impurity induction region. The conductive line, preferably polycrystalline Si, may be substantially flattly embedded in the groove. When the Poly-Si is used, it is not necessary to form the insulating layers 27 and 29. Further an n+ layer 22 is provided beneath the power source line $V_{DD}$ so that any leakage of current to the p type semiconductor 21 is prevented.

Furthermore, grooves h1 and h2, having a width narrower than that of the above grooves H1 and H2, are formed such that the groove h1 is between the n-ch MOS transistor 26 and the p-ch MOS transistor. 25 and the groove h2 is between the p-ch MOS transistor 24 and another n-ch MDS transistor (not shown). Insulating films 28 and 30 are embedded in the grooves h1 and h2, to form an element isolation region ISO. In the structure of the present invention, a wiring channel region is formed to a thickness of, for example, 100 μm. Accordingly, the power source line formed under the wiring channel region can be widely formed, and thus defects such as electromigration, etc., can be prevented.

In FIG. 5A, when a gate 26G of the n-ch MOS transistor 26 is connected to a gate 25G of the p-ch MOS transistor 25 to form an input terminal IN therebetween, and a drain of the n-ch MOS transistor 26 is mutually connected to a drain of the p-ch MOS transistor 25 by an electrode 31 to form an output terminal OUT, a CMOS inverter is constituted.

Figure 6A:
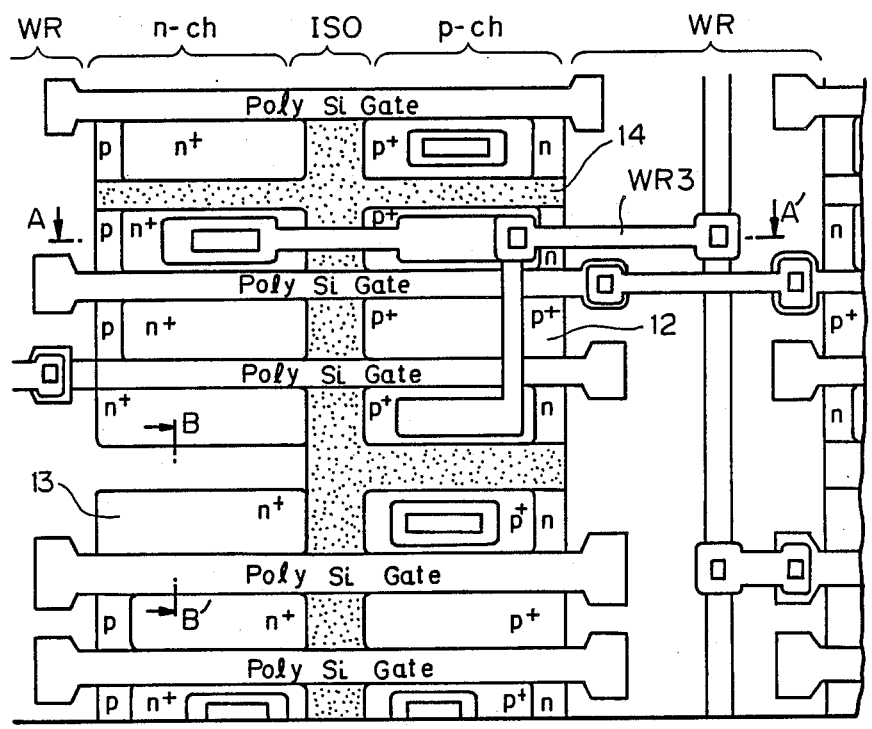
FIG. 6A is a detailed plan view of another embodiment of the present invention.
Figure 6B:
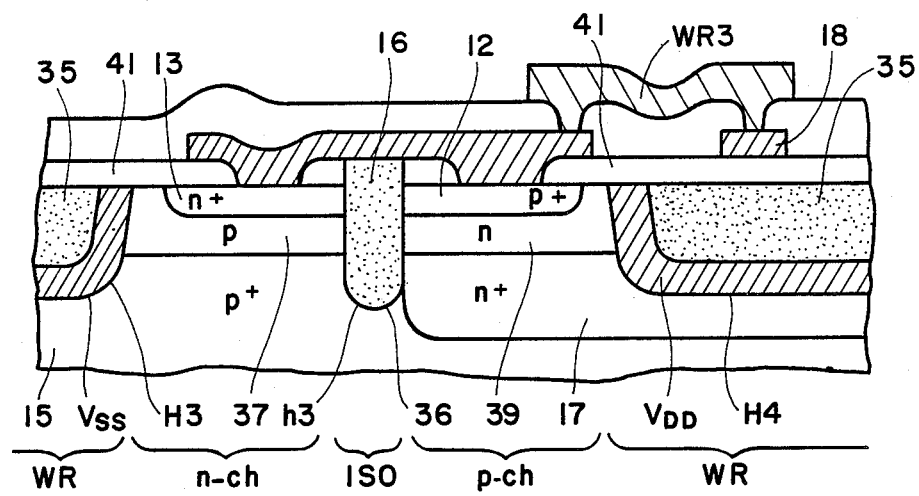
FIG. 6B is a cross-sectional view taken along the line AA in FIG. 6A.
Figure 6C:
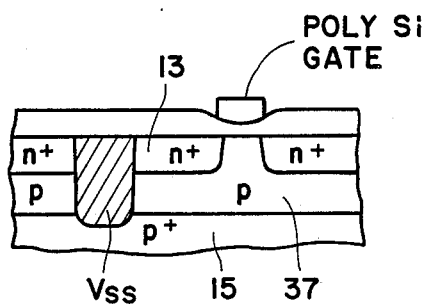
FIG. 6C is a cross-sectional view taken along the line BB in FIG. 6A.

FIG. 6A is a detailed plan view of another example of the present invention, FIG. 6B is a cross-sectional view taken along a line AA of FIG. 6A, and FIG. 6C is a cross-sectional view taken along a line BB of FIG. 6A. In the plan view of FIG. 6A, for clarity, of the impurity induction line portions and the conductive line portions, the insulating layers formed thereon, are omitted. As shown in FIGS. 6B and 6, power source lines $V_{SS}$ and $V_{DD}$ are embedded in a substrate together with the cell array.

The power source lines $V_{SS}$ and $V_{DD}$ are selectively connected to an n-type impurity region 17 in the substrate, and the $V_{SS}$ and $V_{DD}$ lines are covered by an insulating layer. Further, above the insulating layer, a wiring (WR3) for connecting cells is formed.

In FIG. 6A, reference numerals 12, 13 and 14 denote a p+ impurity induction region to be connected to $V_{SS}$, an n+ impurity induction region to be connected to $V_{SS}$, and an insulating layer, respectively.

In FIG. 6B, reference numerals 15, 16, 17 and 18 denote a p+ type silicon substrate, an insulating layer, an n+ impurity induction region (buried layer), and a wiring layer, respectively.

The structure shown in FIGS. 6A, 6B, and 6C can be formed by the following method. First, an n+ type buried layer 17 is formed in an intended p-ch transistor formation region, and a wiring channel formation region adjacent thereto, in a p+ type semiconductor substrate 15. Then an n-type epitaxial growth layer 39 is formed on the n+ type buried layer 17.

Next, a groove h3 for forming an insulation isolating region 16 isolating an intended p-ch transistor formation region and an intended n-ch transistor formation region, a groove H3 for forming the power source line $V_{SS}$ which reaches the p+ type semiconductor substrate 15, and a groove H4 for forming the power source line $V_{DD}$ which reaches the n+ buried layer 17, are formed.

After the power source lines $V_{SS}$ and $V_{DD}$ are embedded in the desired grooves, the power source lines $V_{SS}$ and $V_{DD}$ are flatly covered by an insulating or conductive polycrystalline silicon film 35. In this case, an insulating polycrystalline silicon film 36 may be flatly embedded in the groove h3 for forming the insulation isolating region 16 at the same time or at another time.

Then a p-type impurity is partially introduced to the intended n-ch transistor formation region to form a p-type region 37, and n-type impurities are introduced to the surface of the p-type region 37 to form the n+ type impurity introduction regions 13, which become source and drain region of the n-ch transistor and are formed in such a manner that they are selectively connected to the embedded power source line $V_{SS}$.

A p type impurity is partially introduced into a surface of the n type epitaxial growth layer 39 in an intended p-ch transistor formation region to form the p+ type impurity introduction regions 12, which become source and drain regions of the p-ch transistor and are formed in such a manner that they are selectively connected to the embedded source line $V_{DD}$.

Then, an insulating film is formed on the surface of regions wherein power source lines $V_{SS}$ and $V_{DD}$ are formed, so that a gate insulating film is formed on the intended n-ch transistor formation region and the intended p-ch transistor formation region.

Subsequently, a gate electrode of polycrystalline silicon is formed on the gate insulating film so that a basic cell consisting of a n-ch transistor and a p-ch transistor is realized. To obtain a desired logic circuit the, multilayer wiring 18 of, for example, A1, in the basic cell or between a plurality of basic cells is formed in an insulating layer provided therebetween. Then, wiring connecting a plurality of basic cells is provided in the wiring region (WR) in which the power source lines $V_{SS}$ and $V_{DD}$ are embedded.

Figure 7A:
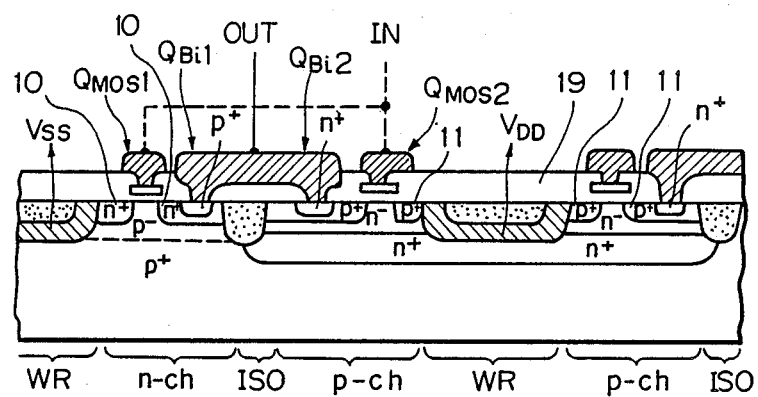
FIG. 7A is a cross-sectional view of a main portion of another LSI chip according to the present invention.

FIG. 7A is another example of the present invention, wherein the present invention is applied to a Bi-MOS-LSI. FIG. 7A is different from FIG. 2 in that a structure in an n-ch, p-ch device region forms a Bi-MOS structure, an n-ch MOS transistor designated by OMOS1 and a pnp transistor designated QBi1 are formed on an n-ch device region, and a p-ch MOS transistor designated by QMOS2 and an npn transistor designated by QBi2 are formed on a p-ch device region.

Figure 7B:
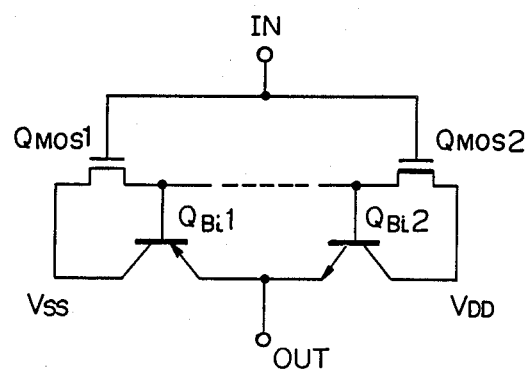
FIG. 7B is a top plan view of FIG. 7A.

The arrangement of the wiring channel region WR, n-ch device region, p-ch device region, and isolation region ISO between the n-ch device region and the p-ch device region is the same as in the case of FIGS. 5A and 5B. FIG. 7B is a view of an equivalent circuit of the wiring portion of FIG. 7A.

As described above, according to a constitution of the complementary LSI chip of the present invention, the power source line of the LSI chip is embedded in a groove provided in a semiconductor substrate, below a wiring channel region, whereby a channel wiring alone can be provided on the substrate. Therefore, the layout efficiency on a chip surface can be improved, which greatly contributes to an improvement of the degree of integration of the LSI.

Additionally, in the present invention, the width of the power source line is widely formed, and thus wiring defects such as electromigration can be prevented.

I claim:

1. An integrated circuit device on a chip comprising:
pairs of p-channel device formation regions and n-channel device formation regions formed on the chip in arrays, each of said pairs having a p-channel device formation region and an n-channel device formation region, the p-channel device formation region having an n-type semiconductor region, p-type source and drain regions provided in the n-type semiconductor region with a space therebetween, and a p-channel gate electrode provided on a first insulating layer formed on the n-type semiconductor region between the p-type source and drain regions, the n-channel device formation region having a p-type semiconductor region, n-type source and drain regions provided in the p-type semiconductor region with a space therebetween, and an n-channel gate electrode provided on a second insulating layer formed on the p-type semiconductor region, said pairs of the p-channel device formation regions and the n-channel device formation regions form adjacent pairs, the adjacent pairs arranged with the p-channel device formation regions adjacent to one another and the n-channel device formation regions adjacent to one another;
a first wiring channel provided in a surface of the chip between the n-channel device formation regions of two of the adjacent pairs;
a first power source wiring layer, situated in said first wiring channel, comprising a metal layer in contact with the n-type source region and the p-type semiconductor region provided in the n-channel device formation regions positioned at either side of said first wiring channel;
a third insulating layer provided in said first wiring channel on said first power source wiring layer;
a second wiring channel provided in a surface of the chip between the p-channel device formation regions of two of the adjacent pairs;
a second power source wiring layer, situated in said second wiring channel, comprising a metal layer in contact with the p-type source region and the n-type semiconductor region provided in the p-channel device formation regions positioned at either side of said second wiring channel;
a fourth insulating layer provided in said second wiring channel on said second power source wiring layer;
isolation regions formed from a fifth insulating layer provided on a surface of the chip between the p-channel device formation regions and the n-channel device formation regions of each of said pairs; and
means acting as an input terminal, for connecting the gate electrodes respectively provided in the n-channel and the p-channel device formation regions positioned at either side of said isolation regions for each of said pairs.

2. An integrated circuit according to claim 1, further comprising means acting as an output terminal to connect the n-type drain region and the p-type drain region respectively provided inside the n-channel and the p-channel device formation regions and positioned on either side of said isolation regions for each of said pairs.

3. An integrated circuit according to claim 1, further comprising:
a p-type emitter region and an n-type emitter region, respectively provided in the n-type drain region and the p-type drain region respectively provided in the n-channel and the p-channel device formation regions, positioned on either side of said isolation regions for each of said pairs;
means acting as an output terminal, for connecting the p-type emitter region and the n-type emitter region;
n-type high impurity regions formed under the n-type semiconductor region of each of the p-channel device formation regions and having a higher impurity concentration than the n-type semiconductor region, said n-type high impurity regions being in contact with said second power source wiring layer;
p-type high impurity regions formed under the p-type semiconductor region of each of the n-channel device formation regions and having a higher impurity concentration than the p-type semiconductor region, said p-type high impurity regions being in contact with said first power source wiring layer;
said n-type emitter region, the p-type drain region in which the n-type emitter region is formed, and the n-type semiconductor region form a npn-type bipolar transistor; and
said p-type emitter region, the n-type drain region in which the p-type emitter region is formed, and the p-type semiconductor region form a pnp-type bipolar transistor.

4. An integrated circuit device having a chip according to claim 1, wherein said device is a MOS LSI.

5. An integrated circuit device having a chip according to claim 1, wherein said device is a complementary MOS LSI.

6. An integrated circuit device having a chip according to claim 1, wherein said device is a complementary MOS or Bipolar MOS LSI.

7. A semiconductor chip comprising:
a semiconductor substrate;
an array of pairs of n-channel formation regions and p-channel formation regions, each of the pairs having an n-channel formation region and a p-channel formation region, positioned adjacent to one another on said semiconductor substrate to form adjacent pairs;

first grooves provided in said semiconductor substrate between the n-channel formation region and the p-channel formation region of each of the pairs, having insulating material therein, for isolating the n-channel formation region and the p-channel formation region of each of the pairs from each other;

second grooves provided in said semiconductor substrate between the n-channel formation regions of the adjacent pairs in said array, having a first power source line situated therein for connecting portions of the n-channel formation regions of the adjacent pairs, and insulating material covering the first power source line; and third grooves provided in said substrate between the p-channel formation regions of the adjacent pairs in said array, having a second power source line situated therein for connecting portions of the p-channel formation regions of the adjacent pairs, and insulating material covering the second power source line.

8. A semiconductor chip according to claim 7, wherein the adjacent pairs of the n-channel formation regions and the p-channel formation regions are arranged so that the n-channel formation regions of each of said pairs are adjacent to the n-channel formation regions of another one of said pairs, and the p-channel formation regions of each of said pairs are adjacent to p-channel formation regions of another one of said pairs.

9. A semiconductor chip according to claim 7, wherein the n-channel and the p-channel formation regions include source and drain regions, and
wherein the first power source line connects the source and the drain regions of the n-channel formation regions of said pairs, and the second power source line connects the source and the drain regions of the p-channel formation regions of said pairs.

10. A semiconductor chip according to claim 7, wherein said first and second power source lines comprise aluminum.

11. A semiconductor chip according to claim 7, wherein said first and second power source lines comprise polycrystaline silicon.

* * * * *

UNITED STATES PATENT AND TRADEMARK OFFICE
CERTIFICATE OF CORRECTION

PATENT NO. : 4,928,164
DATED : May 22, 1990
INVENTOR(S) : TETSU TANIZAWA

It is certified that error appears in the above-identified patent and that said Letters Patent is hereby corrected as shown below:

Col. 3, line 32, "of the" should be --of an--;

line 43, "transistor.25" should be

--transistor 25--;

line 64, "clarity," should be --clarity--;

line 67, "6" should be --6C--;

Col. 4, line 50, "film" should be --film 41--;

line 58, "the," should be --, the--;

Col. 5, line 1, "OMOS1" should be --QMOS1--.

Signed and Sealed this

Fourth Day of February, 1992

Attest:

HARRY F. MANBECK, JR.

*Attesting Officer*     *Commissioner of Patents and Trademarks*